(12) United States Patent
Ong et al.

(10) Patent No.: US 7,425,723 B2
(45) Date of Patent: Sep. 16, 2008

(54) ORGANIC THIN-FILM TRANSISTORS

(75) Inventors: Beng S. Ong, Mississauga (CA); Yuning Li, Mississauga (CA); Yiliang Wu, Mississauga (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 398 days.

(21) Appl. No.: 11/314,687

(22) Filed: Dec. 21, 2005

(65) Prior Publication Data

US 2007/0160847 A1    Jul. 12, 2007

(51) Int. Cl.
*H01L 29/08* (2006.01)
*H01L 35/24* (2006.01)
*H01L 51/00* (2006.01)

(52) U.S. Cl. .......................... 257/40; 257/642; 257/532
(58) Field of Classification Search .................. 257/40, 257/642, 532
See application file for complete search history.

(56) References Cited

U.S. PATENT DOCUMENTS

| 6,621,099 | B2 |   | 9/2003 | Ong et al. |
| 6,770,904 | B2 |   | 8/2004 | Ong et al. |
| 6,872,801 | B2 |   | 3/2005 | Ong et al. |
| 6,897,286 | B2 |   | 5/2005 | Jaspers et al. |
| 7,029,945 | B2 | * | 4/2006 | Veres et al. ................. 438/99 |
| 7,199,049 | B2 | * | 4/2007 | Harada et al. ............... 438/637 |

* cited by examiner

*Primary Examiner*—Zandra Smith
*Assistant Examiner*—Telly D Green
(74) *Attorney, Agent, or Firm*—Eugene O. Palazzo; Fay Sharpe LLP

(57) ABSTRACT

An organic thin-film transistor has a p-type semiconducting layer, wherein the semiconducting layer comprises a crystalline conjugated polyarylamine of the chemical structure:

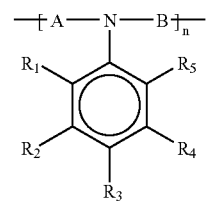

wherein $R_1$ through $R_5$ are independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization; and wherein the polyarylamine has a mobility ($\mu_o$) of $10^{-4}$ cm$^2$/V·sec or greater.

20 Claims, 2 Drawing Sheets

ORGANIC THIN-FILM TRANSISTORS

This development was made with United States Government support under Cooperative Agreement No. 70NANBOH3033 awarded by the National Institute of Standards and Technology (NIST). The United States Government has certain rights in the development.

BACKGROUND

The present disclosure relates, in various embodiments, to semiconducting polymers suitable for use in electronic devices, such as organic thin-film transistors ("OTFT"s). The present disclosure also relates to semiconductor layers produced using such polymers and electronic devices containing such semiconductor layers.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. OTFTs offer not only much lower manufacturing costs, but also appealing mechanical properties such as being physically compact, lightweight, and flexible.

OTFTs are generally composed of a supporting substrate, three electrically conductive electrodes (gate, source and drain electrodes), a channel semiconductor layer, and an electrically insulating gate dielectric layer separating the gate electrode from the semiconductor. The channel semiconductor is in turn in contact with the source and drain electrodes. The materials used to make the OTFTs, and the interfacial properties between various layers of semiconductor, dielectric, and electrodes will affect the performance of the OTFTs. Accordingly, a great deal of recent effort has been devoted to improving the OTFT device performance through new semiconductor materials design, improvement of semiconductor ordering, and optimization of semiconductor and dielectric interface, etc. For examples, see U.S. patent application Ser. Nos. 10/636,389 and 11/315,785 [20041557-US-NP, XERZ 2 01095], the disclosures of which are herein incorporated by reference in their entirety.

Most semiconductor materials for TFTs suffer from their insolubility in solvents suitable for liquid processing. They may also be extremely sensitive to air and light. In order to combat these and other difficulties, organic polythiophenes, such as PQT, have been developed. See U.S. Pat. Nos. 6,621,099; 6,770,904; 6,872,801; and 6,897,284; the disclosures of which are herein incorporated by reference in its entirety. PQT 12 is a printable high-mobility semiconductor suitable for use in OTFTs. It has the chemical structure shown below:

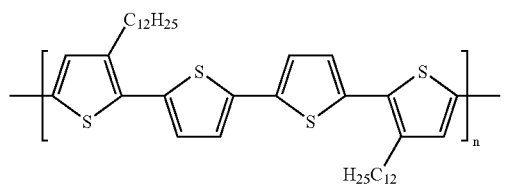

wherein n is the degree of polymerization and is from about 5 to about 5,000. PQT 12 provides mobility up to 0.2 cm$^2$/V·sec and has a current on/off ratio of $10^8$. These attributes are adequate for many electronic applications, such as the backplanes of displays, but not for others. Consequently, there is a need for improved semiconductor materials.

BRIEF DESCRIPTION

The present disclosure is directed, in various embodiments, to p-type semiconducting polymers suitable for use in electronic devices, including OTFTs. These p-type semiconducting polymers are particularly useful for printable thin-film transistor circuits. The semiconducting polymers of the present disclosure are conjugated polyarylamines. In specific embodiments, the semiconducting polymers are crystalline conjugated polyarylamines.

In an exemplary embodiment, the semiconducting polymer has the chemical structure of Formula (I):

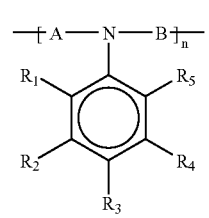

Formula (I)

wherein $R_1$ through $R_5$ are independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization.

In a more specific exemplary embodiment, the semiconducting polymer has the chemical structure of Formula (II):

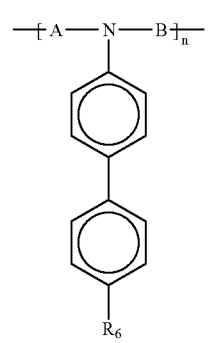

Formula (II)

wherein $R_6$ is independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization.

The present disclosure also provides OTFTs having a p-type semiconducting layer comprising the semiconducting polymers shown above.

These and other non-limiting characteristics of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
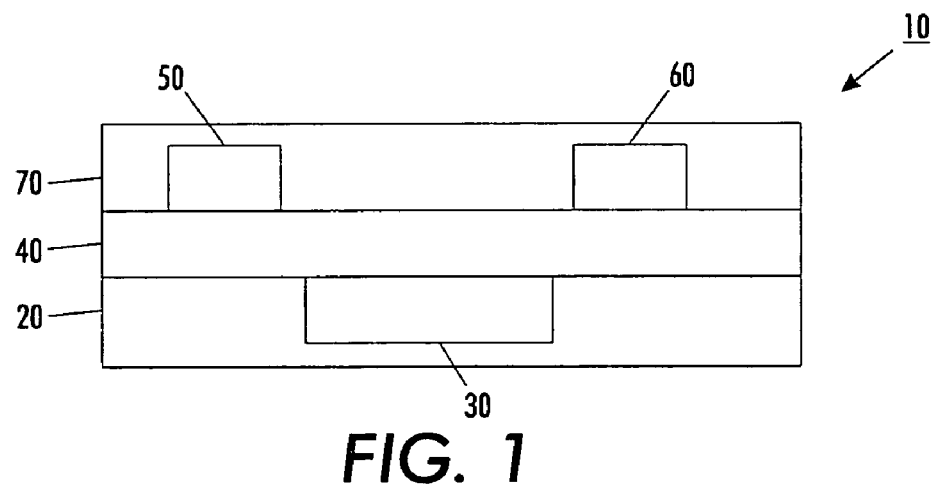
FIG. 1 is a first exemplary embodiment of an OTFT having the semiconductor layer of the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first OTFT configuration. The OTFT 10 comprises a substrate 20 in contact with the gate electrode 30 and a dielectric layer 40. Although here the gate electrode 30 is depicted within the substrate 20, this is not required; the key is that the dielectric layer 40 separates the gate electrode 30 from the source electrode 50, drain electrode 60, and the semiconductor layer 70. The source electrode 50 contacts the semiconductor layer 70. The drain electrode 60 also contacts the semiconductor layer 70. The semiconductor layer 70 runs over and between the source and drain electrodes 50 and 60.

Figure 2:
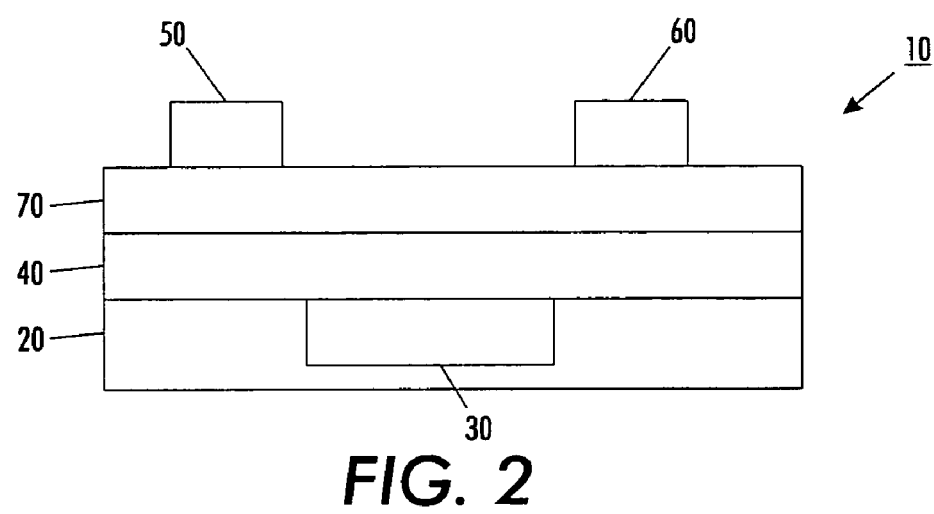
FIG. 2 is a second exemplary embodiment of an OTFT having the semiconductor layer of the present disclosure.

FIG. 2 illustrates a second OTFT configuration. The OTFT 10 comprises a substrate 20 in contact with the gate electrode 30 and a dielectric layer 40. The semiconductor layer 70 is placed on top of the dielectric layer 40 and separates it from the source and drain electrodes 50 and 60.

Figure 3:
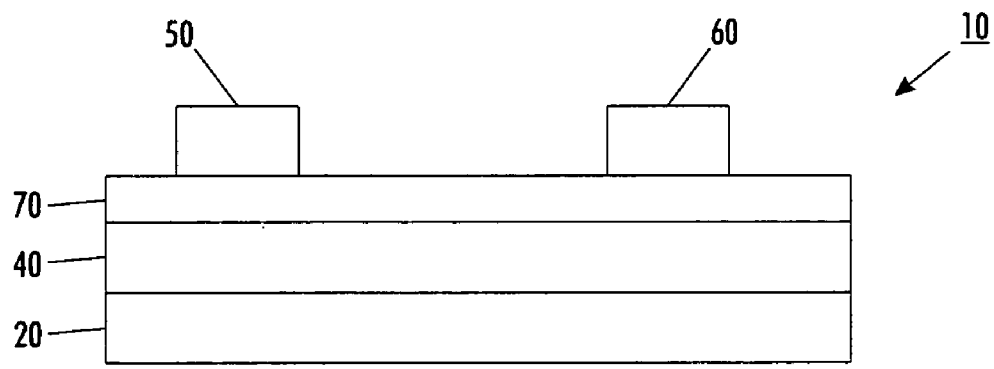
FIG. 3 is a third exemplary embodiment of an OTFT having the semiconductor layer of the present disclosure.

FIG. 3 illustrates a third OTFT configuration. The OTFT 10 comprises a substrate 20 which also acts as the gate electrode and is in contact with a dielectric layer 40. The semiconductor layer 70 is placed on top of the dielectric layer 40 and separates it from the source and drain electrodes 50 and 60.

Figure 4:
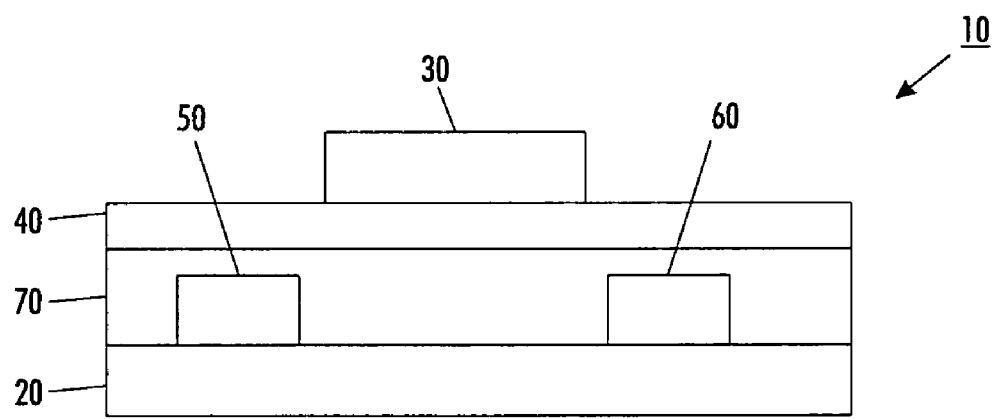
FIG. 4 is a fourth exemplary embodiment of an OTFT having the semiconductor layer of the present disclosure.

FIG. 4 illustrates a fourth OTFT configuration. The OTFT 10 comprises a substrate 20 in contact with the source electrode 50, drain electrode 60, and the semiconductor layer 70. The semiconductor layer 70 runs over and between the source and drain electrodes 50 and 60. The dielectric layer 40 is on top of the semiconductor layer 70. The gate electrode 30 is on top of the dielectric layer 40 and does not contact the semiconductor layer 70.

The semiconductor layer of the present disclosure is a p-type semiconducting layer comprising an organic p-type semiconducting polymer. In particular, the semiconducting polymer is a crystalline conjugated polyarylamine. The term "crystalline" means that the polymer tends to form large ordered crystalline domains, not amorphous domains having no structure or order.

In one embodiment, the semiconducting polymer has the chemical structure of Formula (I):

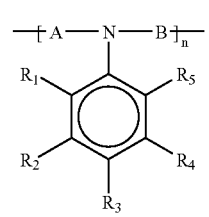

Formula (I)

wherein $R_1$, through $R_5$ are independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization; and the polyarylamine has a mobility ($\mu_0$) of $10^{-4}$ cm$^2$/V·sec or greater. In specific embodiments, n ranges from about 2 to about 5000. In other specific embodiments, at least one of $R_1$ through $R_5$ is a fluorine-substituted alkyl or aryl derivative, such as perfluorinated alkyl or perfluorinated aryl.

In a further embodiment, the semiconducting polymer has the chemical structure of Formula (II):

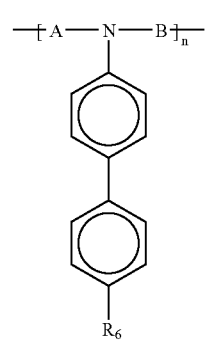

Formula (II)

wherein $R_6$ is independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization; and the polyarylamine has a mobility ($\mu_0$) of $10^{-4}$ cm$^2$/V·sec or greater. In specific embodiments, n ranges from about 2 to about 5000. Substituents in the para position, especially when $R_6$ is alkyl, result in polyarylamines having higher mobility and better crystallinity.

These crystalline conjugated polyarylamines are analogs of the amorphous hole transport materials used in organic light emitting diodes (OLEDs) or active matrix (AMAT) photoreceptors. However, they provide higher hole mobility due to their long-ranged ordering and higher effective π-conjugation lengths. In particular, the crystalline conjugated polyarylamines have a mobility ($\mu_o$) of $10^4$ $cm^2/V \cdot sec$ or greater and an on/off ratio of greater than about $10^3$. The on/off ratio refers to the ratio of the source-drain current when the transistor is on to the source-drain current when the transistor is off. They are also suitable for liquid processing, especially for printing on OTFTs, because they are soluble in common organic solvents such as tetrahydrofuran (THF), dichloromethane, chlorobenzene, dichlorobenzene, toluene, xylene, and mixtures thereof, to form a solution at a concentration of from about 0.1% to about 30%, including from about 0.3% to about 5% by weight, and are then used in liquid deposition.

The semiconductor layer is from about 5 nm to about 1000 nm thick. In certain configurations, the semiconductor layer completely covers the source and drain electrodes. In other configurations, the semiconductor layer only partially covers the source and drain electrodes. The semiconductor layer can be formed by vacuum evaporation, sublimation, spin-on coating, dip coating and other conventional processes known in the art, including those processes described in forming the gate electrode.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about 10-12 Siemens per centimeter (S/cm). The dielectric layer is formed using conventional processes known in the art, including those processes described in forming the gate electrode.

The source and drain electrodes can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally about 0 volt to about 80 volts is applied to the drain electrode to collect the charge carriers transported across the semiconductor channel when a voltage of generally about +10 volts to about −80 volts is applied to the gate electrode. The electrodes may be formed or deposited using conventional processes known in the art.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconductor layer should both be in contact with the dielectric layer. In addition, the source and drain electrodes should both be in contact with the semiconductor layer.

The following examples illustrate an OTFT made according to the methods of the present disclosure. The examples are merely illustrative and are not intended to limit the present disclosure with regard to the materials, conditions, or process parameters set forth therein. All parts are percentages by volume unless otherwise indicated.

EXAMPLES

Example 1

Synthesis of bis(4-chlorophenyl)(4-octylphenyl)amine

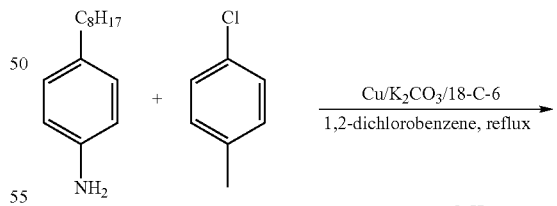

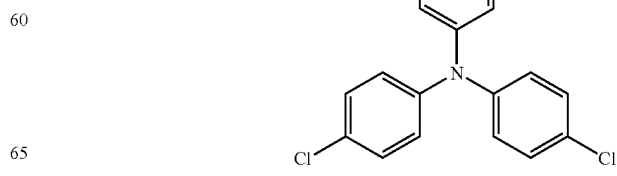

4-Octylaniline (5.00 g, 244.4 mmol), 18-crown-6 (1.29 g, 4.9 mmol), K2CO3 (27.64 g, 194.8 mmol), 1-chloro-4-iodobenzene (14.51 g, 60.9 mmol), copper (6.19 g, 97.4 mmol), and 1,2-dichlorobenzene (100 mL) were added in a 250 mL flask with a condenser connected to a Dean Stark apparatus. The mixture was heated to reflux for 24 hours under argon. The reaction mixture was then cooled to room temperature, diluted with dichloromethane, and filtered. After removal of solvent by distillation, the product was purified using silica gel column chromatography using hexane as eluant. The yield was 4.18 g (40.3%).

Synthesis of poly(N-octylphenyl-diphenylamine)

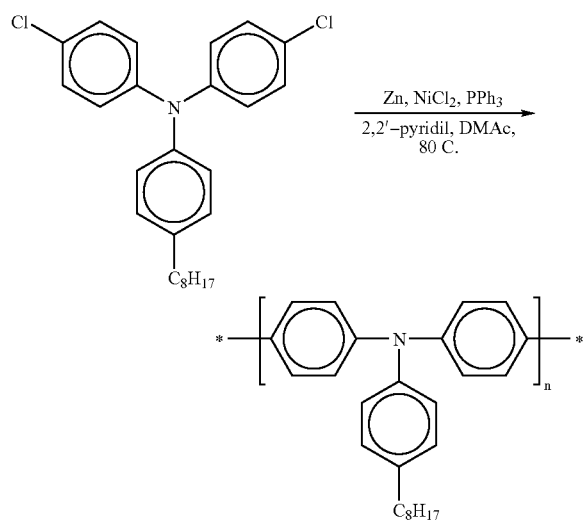

In a well-dried 25 mL flask were added bis(4-chlorophenyl)(4-octylphenyl)amine (1.7057 g, 4 mmol), triphenylphosphine (0.5246 g, 2 mmol), zinc powder (1.046 g, 16 mmol), 2,2'-dipyridil (43.7 mg, 0.28 mmol), anhydrous nickel (II) chloride (36.3 mg, 0.28 mmol), and N,N-dimethylacetamide (DMAc) (8 mL). The mixture was degassed and filled with argon three times and then heated to 80° C. for 24 hours. The reaction mixture was cooled down to room temperature and poured into 200 mL of methanol containing 10 ml of 10 M HCl. The solid material was filtered off, washed with methanol, and acetone (oligomers are soluble in acetone). The solid was re-dissolved in dichloromethane (100 mL)+50 ml and filtered (filter paper washed with hot toluene). Removal of solvent, the concentrated solution (50 mL) was added drop-wise to 200 ml of stirring methanol +10 ml of 10 M HCl. The light yellow solid was washed with water, ammonia solution (2M), water, and methanol, and then dried under vacuum. The yield was 1.339 g (99.8%). Mw/Mn=13700/5730. Melting point (as determined by differential scanning calorimetry): 119° C.

Device Fabrication and Evaluation

A top-contact thin film transistor was built on an n-doped silicon wafer with a thermally grown silicon oxide layer with a thickness of about 200 nanometers thereon, and had a capacitance of about 15 nF/cm$^2$ (nanofarads/square centimeter), as measured with a capacitor meter. The wafer functioned as the gate electrode while the silicon oxide layer acted as the gate dielectric. The silicon wafer was first cleaned with isopropanol, argon plasma, isopropanol and air dried, and then immersed in a 0.1 M solution of octyltrichlorosilane (OTS-8) in toluene at 60° C. for 20 min. Subsequently, the wafer was washed with toluene, isopropanol and air-dried. A solution of poly(N-octylphenyl-diphenylamine) dissolved in dichlorobenzene (0.5 percent by weight) was first filtered through a 0.45 micrometer syringe filter, and then spin-coated on the OTS-8-treated silicon wafer at 1000 rpm for 40 seconds at room temperature. This resulted in the formation of a semiconductor layer with a thickness of ~50 nanometers on the silicon wafer, which was then dried in a vacuum oven at 80° C. for 5-10 hours. Subsequently, gold source and drain electrodes of about 50 nanometers in thickness were deposited on top of the semiconductor layer by vacuum deposition through a shadow mask with various channel lengths and widths, thus creating a series of transistors of various dimensions.

Transistor performance was evaluated in a black box (a closed box which excluded ambient light) at ambient conditions using a Keithley 4200 SCS semiconductor characterization system. The carrier mobility, $\mu_0$, was calculated from the data in the saturated regime (gate voltage, VG<source-drain voltage, VSD) according to equation (1)

$$I_{SD} = C_i\mu(W/2L)(V_G - V_T)^2 \qquad (1)$$

where $I_{SD}$ is the drain current at the saturated regime, W and L are, respectively, the semiconductor channel width and length, $C_i$ is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

The transfer and output characteristics of the devices showed that the compound was a p-type semiconductor. Using transistors with a dimension of W=5,000 μm and L=90 μm, the following average properties from at least five transistors were obtained:

Mobility: 0.76×10$^{-3}$-0.92×10$^{-3}$ cm$^2$/V·sec
On/off ratio: 10$^4$-10$^5$ Example 2

Synthesis of bis(4-bromophenyl)(4-octyibilphenyl)amine

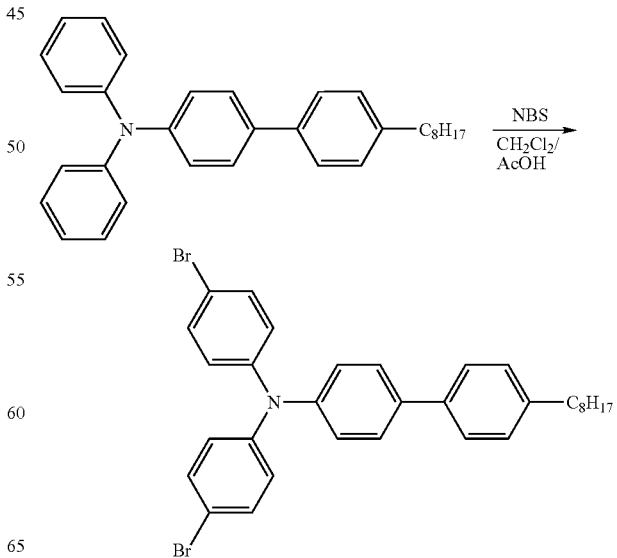

NBS (1.067 g, 6.0 mmol) was added slowly in small portions over a period of 20 minutes to a mechanically stirred N-octylbiphenyl-diphenylamine (1.30 g, 3.0 mmol) solution in a mixture of dichloromethane in a 100 milliliter round-bottomed flask under an inert argon atmosphere. The reaction mixture was stirred at room temperature for 3 hours. The mixture was then diluted with 50 mL dichloromethane, washed with NaHCO$_3$ (10%, 200 mL) and water (200 mL) respectively. After removal of solvent by evaporation, the product was purified using silica gel column chromatography using hexane as eluant. Yield: 1.5 g (88%).

Synthesis of poly(N-octylbiphenyl-diphenylamine)

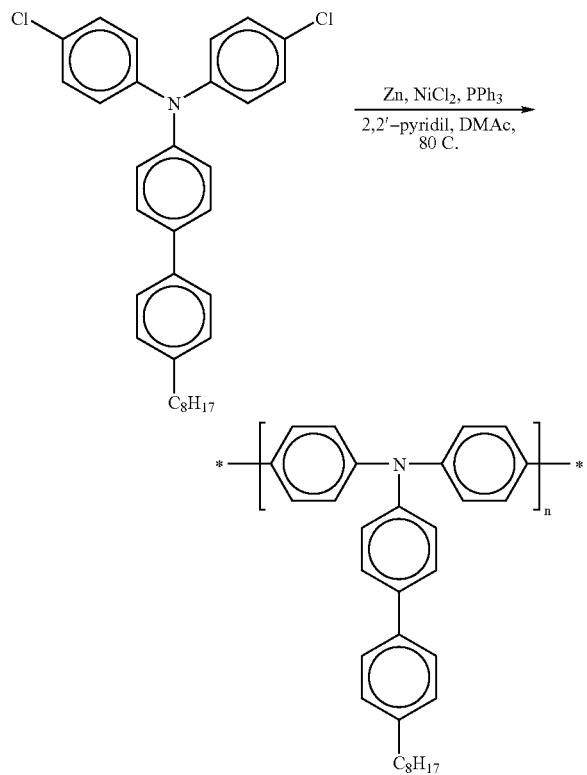

In a 25 mL flask were added bis(4-bromophenyl)(4-octyl-biphenyl)amine (0.688 g, 1.16 mmol), triphenylphosphine (0.152 g, 0.58 mmol), zinc powder (0.3 g, 4.64 mmol), 2,2'-dipyridil (12 mg, 0.0812 mmol), anhydrous nickel (II) chloride (10.5 g, 0.0812 mmol), and N,N-dimethylacetamide (DMAC) (4 mL). The mixture was flushed with argon, then stirred at 80° C. for 22 hours. The reaction mixture was cooled down to room temperature and poured into 100 mL of methanol containing 5 ml of 10 M HCl. The solid material was filtered off, washed with methanol, and acetone. The solid was re-dissolved in dichloromethane (50 mL) and filtered. The concentrated solution (30 mL) was added drop-wise to 200 mL of stirring methanol. The light yellow solid was washed with ammonia solution (2M), water, and methanol, and then dried under vacuum. The yield was 0.40 g (80%). Mw/Mn=10700/4730.

Devices were fabricated and characterized with poly(N-octylbiphenyl-diphenylamine) as the semiconductor layer using the same procedure as described in Example 1. The transfer and output characteristics of the devices showed that the compound was a p-type semiconductor. Using transistors with a dimension of W=5,000 μm and L=90 μm, the following average properties from at least five transistors were obtained:

Mobility: $2.0 \times 10^{-4}$-$3.2 \times 10^{-4}$ cm$^2$/V·sec

On/off ratio: $10^4$-$10^5$

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An organic thin-film transistor having a p-type semiconducting layer, wherein the semiconducting layer comprises a crystalline conjugated polyarylamine having the chemical structure of Formula (I):

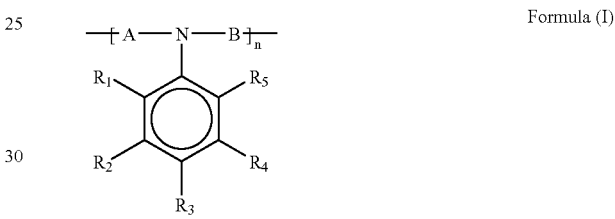

Formula (I)

wherein R$_1$ through R$_5$ are independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization;

and wherein the polyarylamine has a mobility (μ$_0$) of 10$^{-4}$ cm$^2$/V·sec or greater.

2. The organic thin-film transistor of claim 1, wherein the polyarylamine has the chemical structure of Formula (II):

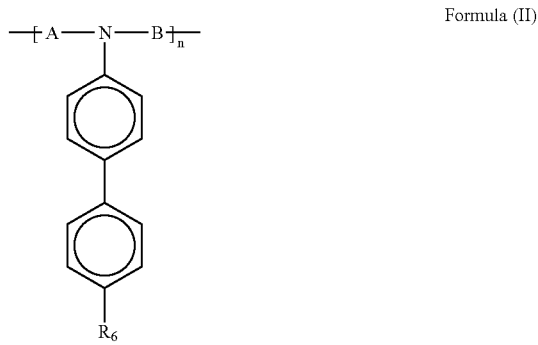

Formula (II)

wherein $R_6$ is independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization.

3. The organic thin-film transistor of claim 2, wherein $R_6$ is alkyl.

4. The organic thin-film transistor of claim 2, wherein A and B are phenylene.

5. The organic thin-film transistor of claim 4, wherein A and B are phenylene and $R_6$ is alkyl.

6. The organic thin-film transistor of claim 2, wherein $R_6$ is a fluorine-substituted alkyl or aryl.

7. The organic thin-film transistor of claim 2, wherein n is from about 2 to about 5000.

8. The organic thin-film transistor of claim 1, wherein n is from about 2 to about 5000.

9. The organic thin-film transistor of claim 1, wherein A and B are phenylene.

10. The organic thin-film transistor of claim 1, wherein at least one of $R_1$ through $R_5$ is a fluorine-substituted alkyl or aryl.

11. The organic thin-film transistor of claim 1, wherein A and B are phenylene; $R_1$, $R_2$, $R_4$, and $R_5$ are hydrogen; and $R_3$ is alkyl.

12. The organic thin-film transistor of claim 1, wherein the semiconducting layer is from about 5 nm to about 1000 nm thick.

13. The organic thin-film transistor of claim 1, further comprising a dielectric layer comprising an organic polymer film.

14. The organic thin-film transistor of claim 1, further comprising at least one electrode made from a material selected from the group consisting of aluminum, gold, chromium, indium tin oxide, nickel, and platinum.

15. The organic thin-film transistor of claim 1, further comprising at least one electrode made from a conductive polymer.

16. The organic thin-film transistor of claim 1, wherein the transistor is a top-contact thin film transistor.

17. The organic thin-film transistor of claim 1, wherein the transistor has an on/off ratio greater than about $10^3$.

18. The organic thin-film transistor of claim 17, wherein the transistor has an on/off ratio from about $10^4$ to about $10^5$.

19. An organic thin-film transistor, comprising:
a supporting substrate;
a gate electrode, a source electrode, and a drain electrode;
a dielectric layer; and
a p-type semiconducting layer;
wherein the semiconducting layer comprises a crystalline conjugated polyarylamine having the chemical structure of Formula (I):

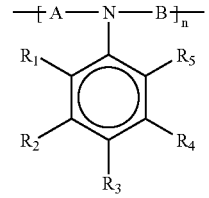

Formula (I)

wherein $R_1$ through $R_5$ are independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization;
and wherein the polyarylamine has a mobility ($\mu_0$) of $10^{-4}$ $cm^2/V \cdot sec$ or greater.

20. An organic thin-film transistor, comprising:
a supporting substrate;
a gate electrode, a source electrode, and a drain electrode;
a dielectric layer; and
a p-type semiconducting layer;
wherein the semiconducting layer comprises a crystalline conjugated polyarylamine having the chemical structure of Formula (II):

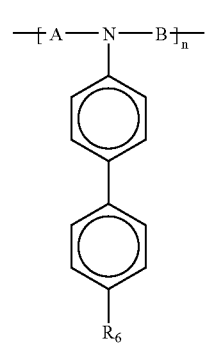

Formula (II)

wherein $R_6$ is independently selected from hydrogen, alkyl having from about 1 to about 30 carbon atoms, aryl having from about 6 to about 40 carbon atoms, heteroaryl having from about 3 to about 40 atoms, alkoxy having from about 1 to about 30 carbon atoms, aryloxy having from about 6 to about 40 carbon atoms, and substituted derivatives thereof; wherein A and B are the same or different independently selected from arylenes having from about 6 to about 20 carbon atoms or heteroarylenes having from about 3 to about 20 carbon atoms; and wherein n is the degree of polymerization;
and wherein the polyarylamine has a mobility ($\mu_0$) of $10^{-4}$ $cm^2/V \cdot sec$ or greater.

* * * * *

UNITED STATES PATENT AND TRADEMARK OFFICE
CERTIFICATE OF CORRECTION

PATENT NO. : 7,425,723 B2
APPLICATION NO. : 11/314687
DATED : September 16, 2008
INVENTOR(S) : Beng S. Ong et al.

Page 1 of 1

It is certified that error appears in the above-identified patent and that said Letters Patent is hereby corrected as shown below:

In the Specification:

Column 1, lines 4 and 5, after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*